United States Patent
Maleville et al.

(10) Patent No.: US 6,403,450 B1
(45) Date of Patent: Jun. 11, 2002

(54) HEAT TREATMENT METHOD FOR SEMICONDUCTOR SUBSTRATES

(75) Inventors: Christophe Maleville, La Terrasse; Thierry Barge, Grenoble; Bernard Aspar, Rives; Hubert Moriceau, Saint-Egreve; André-Jacques Auberton-Herve, Meylan, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/445,314

(22) PCT Filed: Apr. 6, 1999

(86) PCT No.: PCT/FR99/00786

§ 371 (c)(1),
(2), (4) Date: Feb. 29, 2000

(87) PCT Pub. No.: WO99/52145

PCT Pub. Date: Oct. 14, 1999

(30) Foreign Application Priority Data

Apr. 7, 1998 (FR) .............................................. 98 04299

(51) Int. Cl.$^7$ ............................................ H01L 21/322
(52) U.S. Cl. ....................... 438/471; 438/406; 438/455; 438/795
(58) Field of Search ................................ 438/404, 471, 438/795, 765, 766, 455

(56) References Cited

U.S. PATENT DOCUMENTS

| | | | | |
|---|---|---|---|---|
| 4,116,719 A | * | 9/1978 | Shimizu et al. ............... | 148/1.5 |
| 4,824,698 A | | 4/1989 | Jastrzebski et al. ......... | 427/255 |
| 5,646,053 A | | 7/1997 | Schepis et al. ............... | 437/10 |
| 5,786,277 A | * | 7/1998 | Yamamoto ................... | 438/770 |
| 5,930,643 A | * | 7/1999 | Sadana et al. .............. | 438/407 |
| 6,008,110 A | * | 12/1999 | Samata et al. .............. | 438/459 |

FOREIGN PATENT DOCUMENTS

| | | | |
|---|---|---|---|
| EP | 0 328 817 A2 | | 8/1989 |
| EP | 0 444 943 A1 | | 9/1991 |
| EP | 0 464 837 A2 | | 1/1992 |
| EP | 675534 | * | 4/1995 |
| EP | 697713 | * | 2/1996 |

OTHER PUBLICATIONS

Patent Abstracts of Japan, vol. 097, No. 003, Mar. 31, 1997—Japan Publication No. 08316443, Nov. 11, 1996 (Mitsubishi Materials Shilicon Corp.).

Patent Abstracts of Japan, vol. 018, No. 684, Dec. 22, 1994—Japan Publication No. 06275525, Sep. 30, 1994 (Shin Etsu Handotai Co. Ltd.).

T. Abe et al., "Encapsulation of Surface Impurities by Silicon Wafer–Bonding", *Japanase Journal of Applied Physics*, Jan. 1, 1990, pp. 223–226.

Hiroji Aga et al., "Reduction of Defects in Thin Bonded Silicon On Insulator (SOI) Wafers", *Electrochemical Society Proceedings*, 1998, vol. 97–36, pp. 552–558.

* cited by examiner

*Primary Examiner*—Trung Dang
(74) *Attorney, Agent, or Firm*—Jacobson Holman, PLLC

(57) ABSTRACT

The invention concerns a method for treating, a substrate comprising a semi-conducting layer (4) on at least one of its surfaces. Said method comprises a step for annealing the substrate and a step for forming, an oxide layer (6) at the semi-conducting layer (4) surface, carried out before the end of the annealing step, protecting the remainder of the semi-conducting layer (4).

21 Claims, 4 Drawing Sheets

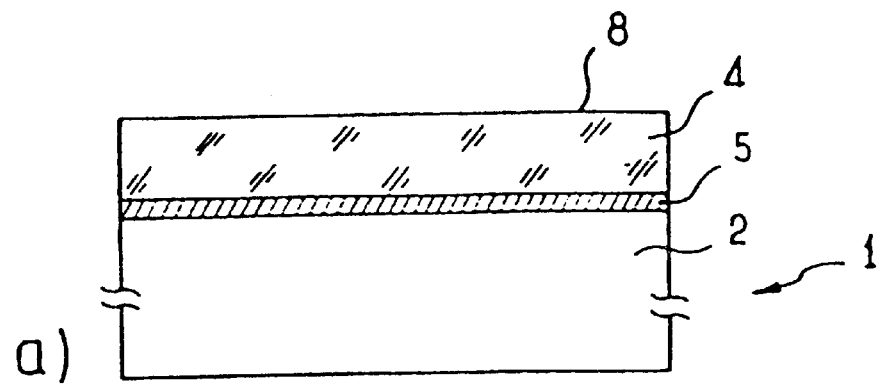
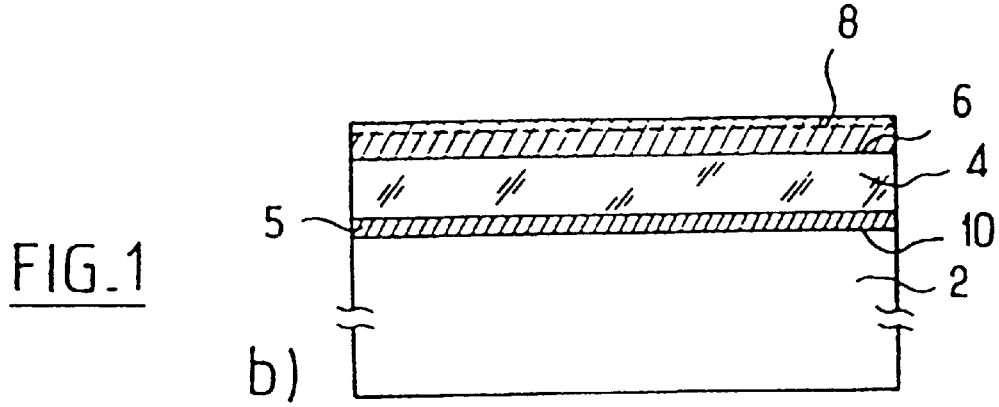
FIG.1
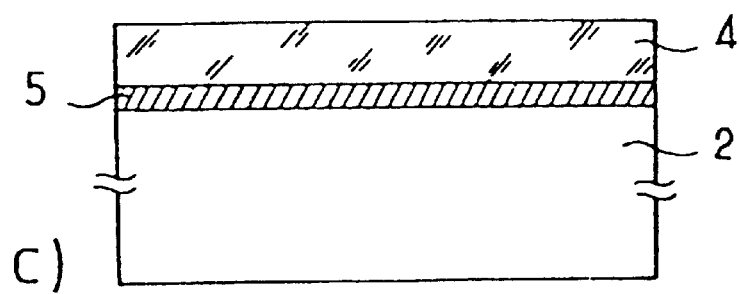

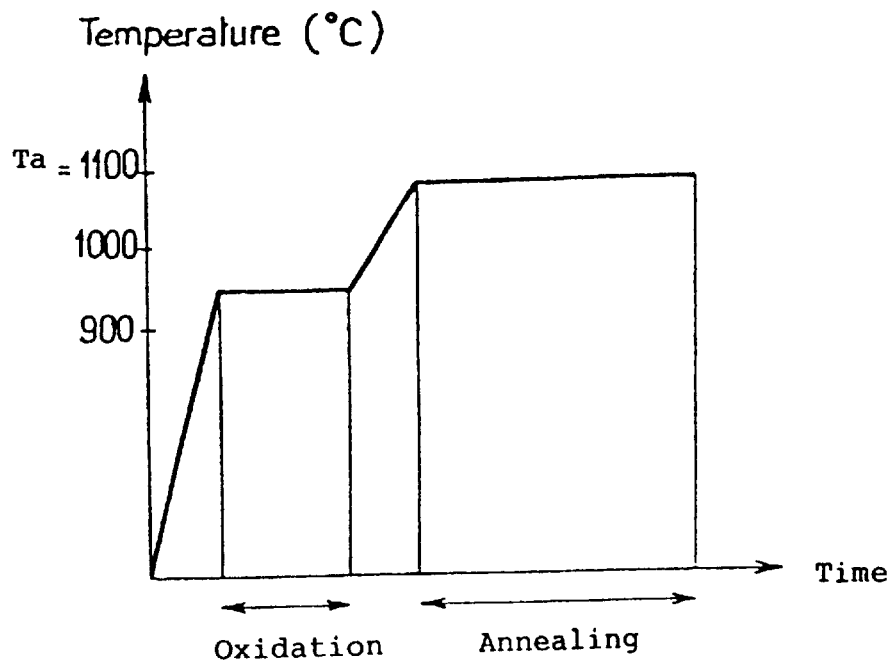
FIG_2
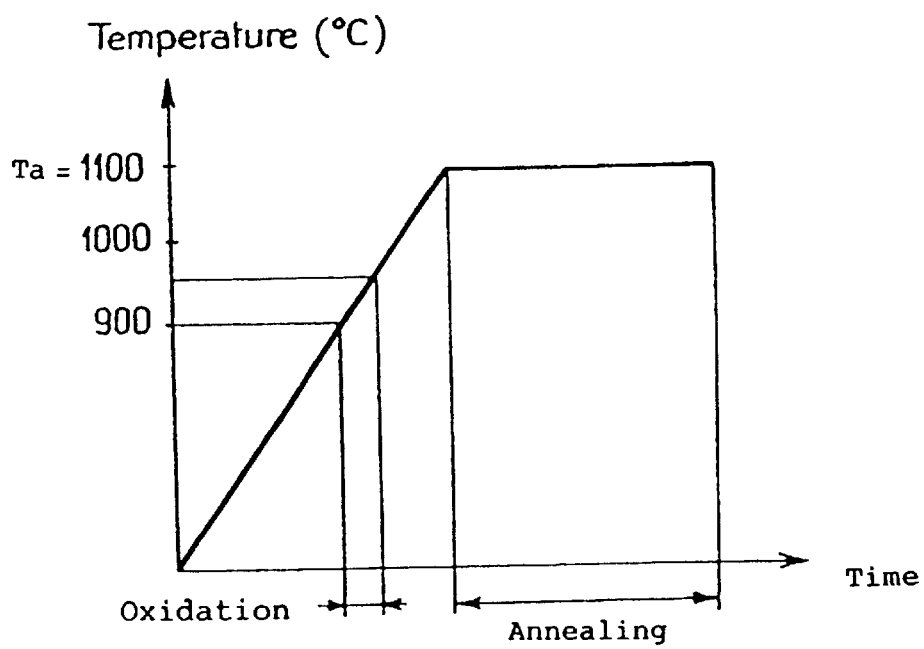
FIG_3

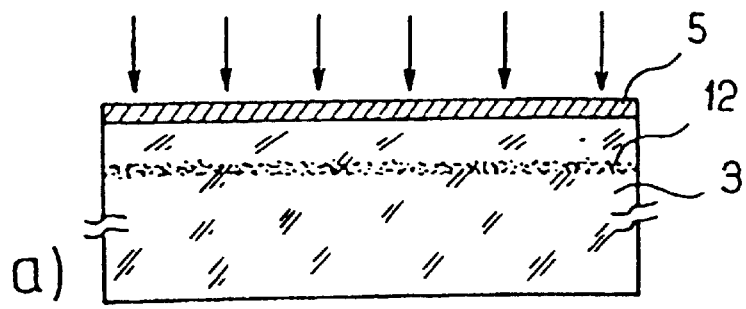
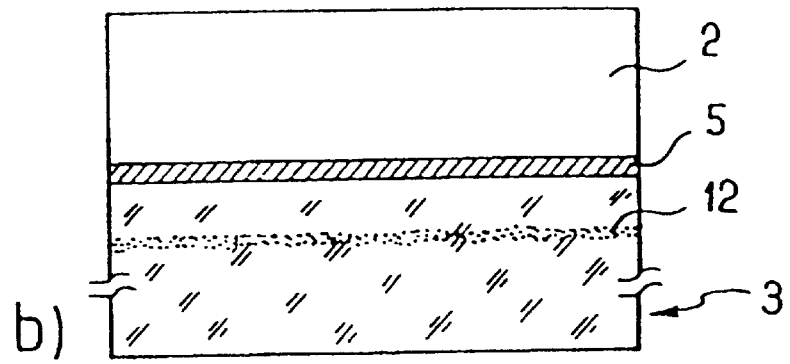
FIG_4
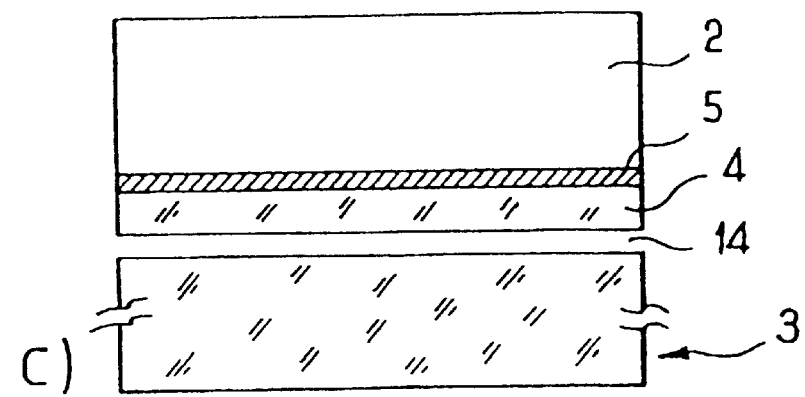

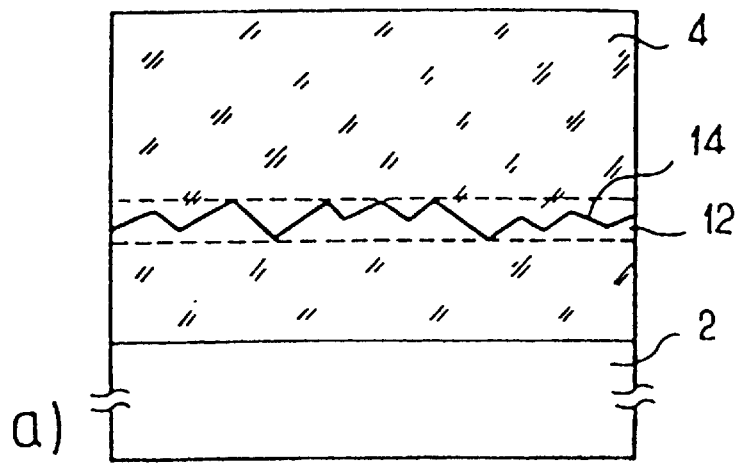
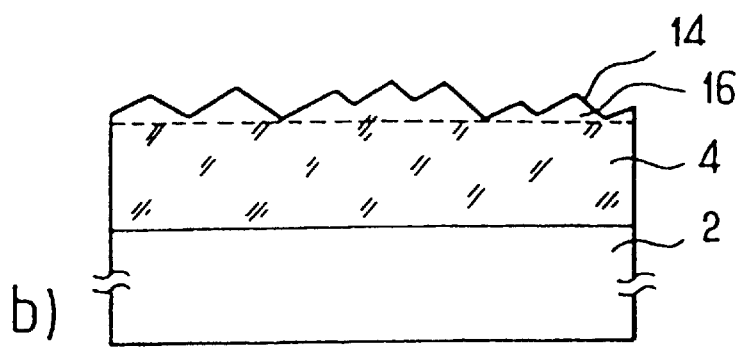
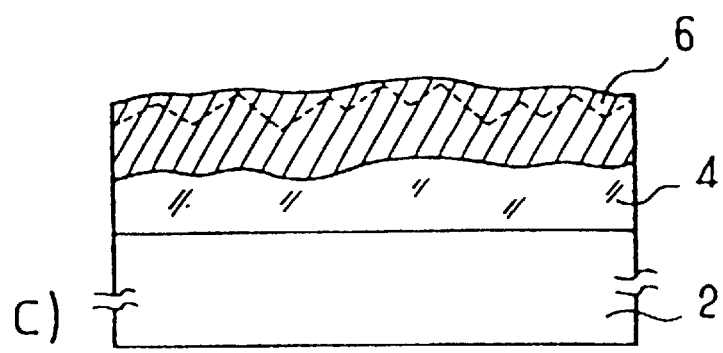
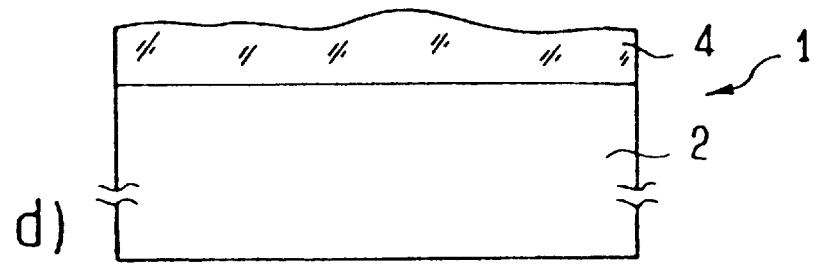
FIG. 5

HEAT TREATMENT METHOD FOR SEMICONDUCTOR SUBSTRATES

BACKGROUND OF THE INVENTION

1. Field of the Invention

The present invention relates to the fabrication of semiconductor components for the microelectronics industry and/or the optoelectronics industry. More specifically, it relates to the field of the fabrication and/or preparation of substrates intended for the production of such components.

2. Background of the Invention

There are certain substrate fabricating processes which consist in transferring a layer, for example a silicon layer, onto a support substrate.

A process for fabricating layers and thin films of semiconductor material, comprising at least three steps, is known, for example from document FR 2,681,472. During a first step, a layer of gaseous microbubbles is created by ion implantation under one face of a wafer of semiconductor material. During a second step, this face of the wafer is transferred onto a support substrate and fastened to the latter. During a third step, the assembly consisting of the wafer and the support substrate is subjected to a heat treatment capable of cleaving the wafer in the implantation layer. The choice of parameters, such as the time and the temperature of this heat treatment, depends on the history and the thermal budget of the semiconductor wafer. This thermal budget is, for example, acquired during the implantation step, by intentional heating and/or by heating due to the ion beam itself. It may also be acquired during an annealing step which precedes the bonding and which is intended to make the implanted atoms migrate for the purpose of facilitating the subsequent cleavage. It may furthermore be acquired during an annealing operation which is carried out before cleavage and is intended to stabilize the bonding. Other heat treatments may -also be envisaged before cleavage.

After cleavage, a thin layer adhering to the support substrate is obtained. This process is called the Smart-Cut® process.

In one particular application of this process, called the SOI (Silicon On Insulator) technique, a silicon-on-insulator layer is produced. Several ways may be envisaged for producing a silicon-on-insulator layer using the process described in the previous paragraph. According to a first way, it is possible, for example, to cover the silicon wafer, on its implantation face, with a layer of insulating oxide and to use a support substrate, for example also made of silicon, for the transfer. According to a second way, it is possible to have a completely semiconducting wafer which is transferred either onto a support substrate covered with a layer of insulator or onto a completely insulating support substrate (e.g. quartz) According to a third way, it is possible to have an insulator on the semiconductor wafer and to transfer this wafer either onto a support substrate which is itself also covered with an insulator or onto a completely insulating substrate. It should furthermore be pointed out here that, in order to obtain an insulator, it is advantageous to carry out a step of forming an oxide layer on the surface of a wafer or of a support substrate, in this case made of silicon, but more generally made of a semiconductor material.

After the three steps of the process described above, problems of the semiconductor layer disbanding from its support substrate may arise. Defects present at the interface between the semiconductor layer and the support substrate may also become electrically active and make the wafer composed of the support substrate/semiconductor layer assembly unusable. In order to alleviate these drawbacks, and more particularly to prevent the layer from disbanding when a polishing operation is envisaged, it is necessary to reinforce the bonding interface between the support substrate and the wafer having the semiconductor layer.

It is known that annealing at relatively high temperatures, i.e. greater than 1000° C. and preferably about 1100° C., allows the bonding interface to be reinforced. Hereafter, any thermal operation intended to improve the properties of the material we will call annealing. This annealing may be a heat treatment carried out at a constant temperature or at a varying temperature. In the latter case, the annealing may be carried out, for example, with a gradual increase in temperature between two values, with a cyclic oscillation between two temperatures, etc.

This type of annealing may be carried out in a non-oxidizing atmosphere or in an oxidizing atmosphere. Annealing in a non-oxidizing atmosphere (nitrogen, argon, vacuum, etc.) generally has the drawback of causing the spurious phenomenon of pitting on the surface of a semiconductor, particularly silicon. Annealing in an oxidizing atmosphere has the drawback of creating defects in the crystal structure. These defects are, for example, of the stacking-fault type and/or, in SOI structures, HF defects (a defect is called an HF defect when its presence is revealed by a halo of decoration of the buried oxide after treatment in a hydrofluoric acid bath), etc.

Moreover, it is sometimes useful, in the case of the application that we mentioned earlier for example, to form an oxide layer on the surface of a silicon layer, for example by oxidation. However, as indicated above, oxidation, but also more generally any formation of a surface oxide layer, is known to generate defects. Now, the presence of these defects in the crystal structure is thoroughly undesirable.

One object of the invention is to provide a process allowing annealing operations to be carried out, especially for stabilizing the bonding interface between a wafer comprising a semiconductor layer, especially a silicon wafer, and a support substrate, without any pitting of the surface of the layer.

Another object of the invention is to provide a process allowing an oxide layer to be formed on the surface of the semiconductor layer, while limiting as far as possible the number of defects introduced into the crystal structure.

SUMMARY OF THE INVENTION

These objects are achieved by virtue of a process for treating a substrate which includes a semiconductor layer on at least one of its faces, characterized in that it comprises a step of annealing the substrate and a step of forming an oxide layer on the surface of the semiconductor layer, which step is carried out before the end of the annealing step, protecting the rest of the semiconductor layer.

The expression "substrate which includes a semiconductor layer on at least one of its faces" should be understood to mean an entirely semiconducting substrate (for example a silicon substrate), or a stack of semiconducting layers, or else a substrate comprising inhomogeneous structures or a substrate comprising components or parts of components at various stages in their fabrication.

By way of example, the semiconductor layers have a thickness of a few tens of Å to a few tens of microns.

Thus, by virtue of the process according to the invention, an oxide layer is formed on the surface of the semiconductor layer. This oxide layer protects the rest of the semiconductor layer, during the annealing step, in order especially to avoid the pitting phenomenon. The oxide layer may be formed by deposition of an oxide on the surface of the semiconductor layer (particularly, but not exclusively, in the case of non-oxidizable semiconductors), by thermal oxidation of the surface region of the semiconductor layer or else by deposition of an oxide on the surface of the semiconductor layer followed by thermal oxidation of the semiconductor through the oxide layer already deposited. In all cases, the oxide may be composed of elements in the semiconductor material and of other elements, such as nitrogen, etc.

The combination of the step of forming a surface oxide layer and of the annealing step, in the process according to the invention, makes it possible in particular to reinforce the bonding interface between the semiconductor layer and the support substrate, preventing the formation of defects, and more particularly the formation of pitting-type defects.

Moreover, the step of annealing the substrate makes it possible to heal the semiconductor layer of the defects generated during the previous steps in the fabrication and preparation process. More particularly, the annealing step may be carried out for a time and at a temperature which are such that the crystal defects, such as stacking faults, HF defects, etc., generated in the semiconductor layer during the step of forming a surface oxide layer are healed. Thus, it is possible to form an oxide layer on the surface of a semiconductor layer without dramatically increasing its level of defects. The Applicant has furthermore discovered that the healing of the semiconductor material by annealing gives it better resistance to any steps subsequent to the formation of an oxide layer on the surface of the semiconductor layer. This is because a semiconductor layer contains fewer defects after formation of a surface oxide layer, when it has been annealed prior to the formation of the oxide.

According to a variant of the process according to the invention, the process comprises, after the annealing step, a deoxidation step in order to remove the oxide layer formed on the surface of the semiconductor layer.

According to another variant, the process according to the invention comprises several steps of forming a surface oxide layer and several deoxidation steps, at least the final step of forming a surface oxide layer being followed by an annealing step.

According to the latter two variants, the process implemented according to the invention makes it possible in particular to thin the semiconductor layer, to remove part of the semiconductor layer containing a high concentration of defects or else to reduce the roughness of the surface of the layer. Thus, the process according to the invention proves to be particularly useful when, after the implantation, bonding and cleaving steps of the abovementioned process, it is desired, on the one hand, to remove the part disturbed by the implantation, i.e. in the cleavage zone (this part in fact contains an enormous number of defects) and, on the other hand, to reduce the roughness of the surface resulting from the cleavage. This formation of a sacrificial surface oxide layer on part of the semiconductor layer makes it possible to avoid the drawbacks of a polishing operation by itself. This is because the technique of polishing generates defects of the mechanical lesion type, strain-hardened zones, etc. When chemical-mechanical polishing is used, defects due to the chemistry may be added to the previous ones. In addition, the polishing generally results in lack of thickness uniformity. This latter drawback becomes more and more critical as the thickness of material to be removed increases, and therefore as the length of the polishing step increases. This is the case especially when the thickness to be removed by polishing reaches 100 nm. Thus, all these drawbacks usually result in a lack of reproducibility in the polishing results. In addition, lengthy polishing slow down the execution of the process and result in a drop in productivity. The advantages of forming a sacrificial surface oxide layer in accordance with the process according to the invention will therefore be appreciated, since it makes it possible to remove material and to thin a semiconductor layer. If this thinning is completed by formation of a sacrificial surface oxide layer in a polishing step, the defects generated by the polishing operation may then be developed on a smaller scale.

According to another variant, the support substrate covered with the semiconductor layer may be stored or delivered, for example to a semiconductor component fabricator, with a protective oxide layer which will be removed when the treatment of the substrate is continued.

BRIEF DESCRIPTION OF THE DRAWINGS

Other aspects, objects and advantages of the invention will appear on reading the detailed description which follows. The invention will also be more clearly understood with the aid of the references to the drawings in which:

FIG. 1 shows diagrammatically the steps of an example of how the process for treating semiconductor layers is implemented according to the invention;

FIG. 2 shows a diagram of an example of how the temperature to which a substrate is heated varies during its treatment by a process according to the present invention;

FIG. 3 shows a diagram of another example of how the temperature to which a substrate is heated varies during its treatment by a process according to the present invention;

FIG. 4 shows diagrammatically the steps of a process of the prior art for treating substrates for the microelectronics and optoelectronics industries; and FIG. 5 shows diagrammatically the steps of smoothing a cleavage surface using the process according to the invention.

DETAILED DESCRIPTION OF THE PREFERRED EMBODIMENT

According to a non-limiting example of how the process according to the invention is implemented, illustrated in FIG. 1, this is carried out on a wafer 1 which comprises a support substrate 2 covered by a silicon layer 4, together with a buried-oxide interlayer 5 (FIG. 1a).

This process comprises a step of forming a surface oxide layer in order to form a silicon oxide layer 6 (FIG. 1b), an annealing step and a deoxidation step (FIG. 1c).

During the step of forming the surface oxide layer, the silicon oxide layer 6 develops in the vicinity of the initial surface 8 of the silicon layer 4.

The formation of a surface oxide layer may be carried out using a dry process or a wet process. Using a dry process, the surface oxide layer is formed, for example, by heating the wafer 1 in gaseous oxygen. Using a wet process, the surface oxide layer is formed, for example, by means of water vapour.

Preferably, the step of forming the surface oxide layer and the annealing step of the process according to the invention are decoupled temporally. Also preferably, the temperature at which the surface oxide layer is formed is between 900 and 1000° C., since the formation of a surface oxide layer generates fewer defects in the SOI structure the lower its temperature. On the other hand, the annealing step is advantageously carried out above 1000° C.

It is preferred to form the surface oxide layer using a wet process, since it introduces fewer defects of the type of those already mentioned. The wet process also gives higher rates of formation of the surface oxide layer than the dry process and makes it possible to maintain reasonable kinetics of formation of the surface oxide layer, while still working at lower temperature. Preferably therefore, the wet process is used at a temperature of approximately 950° C., with annealing at 1100° C. in a non-oxidizing atmosphere, for example in nitrogen, in argon, etc.

As shown in FIG. 2, a surface oxide layer may be formed during a first temperature hold at 950° C., with annealing at a second temperature hold at $T_a=1100°$ C.

In some cases, the wafer 1 may be raised to a temperature of approximately 1200° C. It may even be envisaged, for example in order to stabilize the bonding interface 10 between the buried-oxide layer 5 and the support substrate 2, to carry out this annealing at even higher temperatures, but undesirable effects may arise, such as metallic contaminations coming from the annealing equipment for example.

As illustrated in the diagram in FIG. 3, according to one variant, the surface oxide layer may also be formed, for example, during the phase of raising the temperature of the substrate to the annealing temperature $T_a$, at which a temperature hold is carried out.

In the implementation examples illustrated by FIGS. 2 and 3 and described above, the step of forming the surface oxide layer is carried out before the actual annealing step starts. However, according to another way of implementing the process according to the invention, the formation of the surface oxide layer may be carried out both during the phase of raising the temperature of the substrate and during the beginning of the annealing phase. It may also be entirely carried out during the beginning of the annealing phase, for example by introducing a metered quantity of an oxidizing gas into the annealing atmosphere. Preferably, it is carried out in such a way that the formation of the surface oxide layer is completed before the end of the annealing.

The deoxidation step is preferably carried out by immersing the wafer 1 in a bath of hydrofluoric acid, which exhibits good silicon/silicon oxide etching selectivity.

Two examples of application of the invention will be explained below, in the context of the Smart-Cut® process. This process is used here to fabricate SOI structures.

EXAMPLE 1

The process according to the invention, as described above, may be carried out for a time and at a temperature which are such as to reinforce the bonding interface 10, between the buriedoxide layer 5 and the support substrate 2, obtained after the process illustrated in FIG. 4 has been implemented.

According to this process, a silicon wafer 3 covered with a buried-oxide layer is subjected to hydrogen ion implantation, for example using a dose of $5\times10^{16}$ H$^+$/cm$^2$, at 100 KeV, in an implantation zone 12 located at a defined depth (FIG. 4a). After implantation, the silicon wafer 3 is brought into contact with a support substrate 2 (FIG. 4b). The assembly, comprising the silicon wafer 3 and the support substrate 2, is then subjected to a treatment step capable of allowing separation from the silicon wafer 3, in the implantation zone 12 (FIG. 4c). This step is, for example, carried out by raising the assembly comprising the silicon wafer 3 and the support substrate 2 to a temperature which depends on the implantation conditions and which may be as high as approximately 600° C. According to a variant, mechanical stresses are applied in combination with the heat treatment or as a replacement of this heat treatment. After the semiconductor layer 4 has been separated from the wafer 3, a support substrate 2 covered by a thin silicon layer 4, together with a buried-oxide interlayer 5, is obtained. The free surface of this silicon layer 4 is a cleavage surface 14.

It is sometimes necessary, for example before polishing the cleavage surface 14 or in order to prevent the formation of electrically active defects, to carry out a step of stabilizing the bonding interface 10. This stabilization is obtained by annealing the substrate at a temperature close to 1100° C., for example. The annealing is carried out in an atmosphere containing at least one non-oxidizing gas, such as argon. A prior oxidation step is therefore preferably carried out in the region of 950° C. in order to form an oxide layer 6 intended to protect the silicon layer 4 during this stabilization annealing. After this annealing, the silicon layer 4 undergoes a deoxidation step, intended to remove the protective oxide layer 6.

EXAMPLE 2

In the process illustrated by FIG. 4 and already described in the presentation of the first example, after cleavage the cleavage surface 14 of the silicon layer 4 is too rough and there remains, subjacent to this cleavage surface 14, a disturbed zone 16 corresponding to the remaining part of the implantation zone 12 (FIG. 5a and 5b). The process according to the invention may therefore be carried out in order to remove this disturbed zone 16 and to re-establish a suitable roughness. According to the technique of the prior art, these operations are carried out by chemical-mechanical polishing. However, polishing is not completely satisfactory since it has the drawbacks already mentioned above. The process according to the invention remedies them by forming a sacrificial surface oxide layer.

The silicon layer 4 is oxidized, by heat treatment using one of the techniques explained above, in order to form an oxide layer 6 (FIG. 5c). This oxide layer 6 develops in the vicinity of the cleavage surface 14 and the interface between the oxide and the silicon advances into the depth of the silicon, progressively smoothing the roughness of the cleavage surface 14.

An annealing step in accordance with the process according to the invention is then carried out.

The oxide layer 6 is then consumed chemically (FIG. 5d). By way of example in this case, in order to remove from one thousand Ångströms to a few thousands of ångströms, the wafer 1 is immersed in a 10 or 20% hydrofluoric acid bath for a few minutes.

In order to carry out this variant of the process according to the invention, the important parameters are the temperature, the oxidation time, the oxidizing character of the atmosphere and the oxygen content. These parameters may be well controlled. This makes this application of the process according to the invention to the formation of a sacrificial layer very reproducible. This process is also flexible to use and is consistent with all the usual substrate treatment procedures for the fabrication of components for the microelectronics industry.

The process according to the invention may also include at least one step of forming a surface oxide layer and at least one deoxidation step, at least one annealing step being carried out after the final step of forming a surface oxide layer so as to heal the defects generated by the step or steps of forming an oxide layer on previous surfaces. According to another variant, the process according to the invention comprises several steps of forming a surface oxide layer and several deoxidation steps, each step of forming a surface oxide layer being followed by an annealing step.

The abovementioned steps of forming a sacrificial layer may be combined with a polishing step. This polishing step may or may not be after the steps of forming a sacrificial layer. The combination of these steps may be used to remove part of the silicon layer having a high concentration of crystal defects, these being, for example, in the zone disturbed by the ion implantation. This combination may also be used to reduce the roughness. By virtue of the formation of a sacrificial surface oxide layer and of the deoxidation with which it is associated, the polishing operation may then be very substantially shorter and therefore less liable to damage the silicon layer 4. Carried out after the formation and removal of a sacrificial surface oxide layer, it is more effective since the roughness, difficult to decrease by chemical-mechanical polishing, has already been reduced to a large extent.

According to an advantageous variant, a step of forming a surface oxide layer is followed by an annealing step which annealing heals the defects generated by the formation of the surface oxide layer and stabilizes the bonding interface 10, a deoxidation step is carried out after this annealing and, finally, a short polishing step allows the reduction in roughness to be completed.

In general, the process according to the invention is implemented in the context of processes designed to transfer layers of materials onto a support substrate 2 (Smart-Cut®, etc.). It therefore serves to reinforce the interface where the materials are bonded to the support substrate 2 and/or to remove a layer in the vicinity of a highly disturbed zone 16. The process according to the invention is also implemented in the context of processes designed to produce SOI structures (SIMOX, Smart-Cut®, etc.) or in the context of the use of these structures. It then serves to thin or oxidize a silicon layer 4 without dramatically increasing the level of defects in this silicon layer 4.

Again, the process according to the invention is advantageously used to form an oxide layer 6 locally on at least part of the surface of the semiconductor layer 4.

What has been described above in the case of silicon may be transposed to other semiconductors, especially silicon compounds such as SiC, SiGe, etc.

The process according to the invention makes it possible to obtain SOI-type semiconductor structures in which the HF defect density is less than 1 defect/cm$^2$ in a semiconductor layer 4 whose thickness is less than 2000 Angstroms.

The process according to the invention also makes it possible to obtain semiconductor structures in which a semiconductor layer 4, having a uniformity of thickness of better than 5%, has an rms roughness value of less than 2 nm.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A process for treating a substrate which includes a semiconductor layer on at least one of its faces, comprising the steps of:

forming an oxide layer on a surface of the semiconductor layer; and annealing the substrate under an atmosphere which leaves said oxide layer unaffected such that said oxide layer remains and limits formation of defects during said step of annealing.

2. The process according to claim 1, wherein the step of forming the oxide layer is carried out by thermal oxidation of the semiconductor layer.

3. The process according to claim 1, wherein the substrate is annealed in an atmosphere comprising at least one non-oxidizing gas.

4. The process according to claim 1, wherein the annealing step is carried out for a time and at a temperature which are such that crystal defects generated in the semiconductor layer by the formation of the surface oxide layer are healed.

5. The process according to claim 1, further comprising, after the annealing step, a deoxidation step in order to remove the oxide layer formed on the surface of the semiconductor layer.

6. The process according to claim 5, wherein said deoxidation step thins the semiconductor layer.

7. The process according to claim 1, wherein the substrate further includes a support substrate and the annealing step is carried out for a time and at a temperature which are such that a bonding interface between the semiconductor layer and the support substrate is reinforced.

8. The process according to claim 1, comprising several steps of forming a surface oxide layer and several deoxidation steps, at least a final step of forming a surface oxide layer being followed by an annealing step.

9. The process according to claim 1, further comprising a subsequent polishing step.

10. The process according to claim 1, further comprising a step of implanting atoms under at least one face of a wafer of a semiconductor material in an implantation zone, a step of bringing said face of the wafer subjected to the implantation into intimate contact with a support substrate, and a treatment step capable of allowing separation from the wafer, in the implantation zone, in order to separate a semiconductor layer from the wafer and constitute the substrate comprising this semiconductor layer.

11. The process according to claim 1, wherein the semiconductor is silicon.

12. The process according to claim 11, wherein said annealing step is carried out above 1000° C.

13. The process according to claim 11, wherein said step of forming an oxide layer is carried out at a lower temperature than said annealing step.

14. The process according to claim 8, wherein each step of forming a surface oxide layer is carried out before each annealing step starts.

15. The process according to claim 1, wherein at least one step of forming a surface oxide layer is carried out, at least partially, during a phase of raising a temperature of the substrate to an annealing temperature.

16. The process according to claim 1, wherein said step of forming a surface oxide layer is carried out, at a same temperature as that of the annealing step, by introducing a metered quantity of an oxidizing gas into the annealing atmosphere.

17. The process according to claim 1, wherein the oxide layer is formed locally on at least part of the surface of the semiconductor layer.

18. A SOI semiconductor structure produced by forming an oxide layer on a surface of a semiconductor layer and annealing the structure under an atmosphere which leaves said oxide layer unaffected such that said oxide layer remains and limits formation of defects during the annealing, said structure having an HF defect density less than 1 defect/cm² in the semiconductor layer which has a thickness of less than 2000 Angstroms.

19. A semiconductor structure produced by forming an oxide layer on a surface of a semiconductor layer and annealing the structure under an atmosphere which leaves said oxide layer unaffected such that said oxide layer remains and limits formation of defects during the annealing, the semiconductor layer having a uniformity of thickness of better than 5% and an rms roughness value of less than 2 nm.

20. The process according to claim 12, wherein said annealing step is carried out at a temperature of about 1100° C.

21. The process according to claim 13, wherein said step of forming the oxide layer is carried out at a temperature of between 900° C. and 1000° C.

* * * * *